(12) United States Patent
Rau et al.

(10) Patent No.: US 10,993,353 B2
(45) Date of Patent: Apr. 27, 2021

(54) FAN CONTROLLED AMBIENT AIR COOLING OF EQUIPMENT IN A CONTROLLED AIRFLOW ENVIRONMENT

(71) Applicant: HEWLETT PACKARD ENTERPRISE DEVELOPMENT LP, Houston, TX (US)

(72) Inventors: Timothy M Rau, Meridian, ID (US); Matthew Neumann, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 190 days.

(21) Appl. No.: 15/511,719

(22) PCT Filed: Sep. 29, 2014

(86) PCT No.: PCT/US2014/057949
§ 371 (c)(1),
(2) Date: Mar. 16, 2017

(87) PCT Pub. No.: WO2016/053227
PCT Pub. Date: Apr. 7, 2016

(65) Prior Publication Data
US 2017/0311487 A1    Oct. 26, 2017

(51) Int. Cl.
*H05K 7/20* (2006.01)
*G06F 1/20* (2006.01)
*G05B 15/02* (2006.01)

(52) U.S. Cl.
CPC ......... *H05K 7/20745* (2013.01); *G05B 15/02* (2013.01); *G06F 1/20* (2013.01);
(Continued)

(58) Field of Classification Search
CPC ............ G06F 1/20; G06F 1/203; G06F 1/206; H05K 7/20836; H05K 7/20727;
(Continued)

(56) References Cited

U.S. PATENT DOCUMENTS

| | | | | | |
|---|---|---|---|---|---|
| 5,493,457 | A | * | 2/1996 | Kawamura | G11B 33/142 360/97.12 |
| 5,691,883 | A | * | 11/1997 | Nelson | G06F 1/20 165/122 |

(Continued)

FOREIGN PATENT DOCUMENTS

| | | |
|---|---|---|
| GB | 2485468 | 5/2012 |
| JP | 2006108166 | 4/2006 |

(Continued)

OTHER PUBLICATIONS

Brent Elileson, "Ambient Air Cooling," Jun. 11, 2012, <http//www.datacenterjournal.com/facilities/ambient-air-cooling/>, 5 pps.
(Continued)

*Primary Examiner* — Darrin D Dunn
(74) *Attorney, Agent, or Firm* — Hewlett Packard Enterprise Patent Department (57) ABSTRACT

In some examples, a system uses ambient air from outside a controlled airflow environment to cool equipment within the controlled airflow environment. The system can include ductwork that seals the ambient air from air outside of the ductwork within the controlled airflow environment. The system can further include a passive heat exchanger connected to the equipment and extending into an interior of the ductwork to allow heat exchange between the equipment and the ambient air. The system can further include a fan to flow the ambient air through the ductwork, the fan being connectable to the equipment to allow the equipment to control the operation of the fan.

19 Claims, 6 Drawing Sheets

(52) U.S. Cl.
CPC ..... *H05K 7/20736* (2013.01); *H05K 7/20772* (2013.01); *H05K 7/20836* (2013.01); *H05K 7/20145* (2013.01); *H05K 7/20172* (2013.01); *H05K 7/20181* (2013.01); *H05K 7/20245* (2013.01)

(58) Field of Classification Search
CPC .......... H05K 7/20754; H05K 7/20172; H05K 7/20145; H05K 7/20154; H05K 7/20209; H05K 7/20609; H05K 7/20618; H05K 7/207; F24F 2110/50; F24F 2110/70; F24F 2120/10
See application file for complete search history.

(56) References Cited

U.S. PATENT DOCUMENTS

| | | | | |
|---|---|---|---|---|
| 5,828,549 A * | 10/1998 | Gandre | ................ | G06F 1/20 361/695 |
| 5,894,987 A * | 4/1999 | Layne | ................ | B60H 1/00835 165/44 |
| 5,942,017 A * | 8/1999 | Van Winkle, Sr. | .... | B01D 46/00 55/385.1 |
| 5,946,190 A * | 8/1999 | Patel | ................ | H05K 7/20154 165/104.21 |
| 6,199,387 B1 * | 3/2001 | Sauterleute | ............ | B64D 13/06 62/87 |
| 6,253,834 B1 * | 7/2001 | Sterner | ................ | G06F 1/203 165/104.34 |
| 6,397,927 B1 * | 6/2002 | Sterner | ................ | G06F 1/203 165/104.33 |
| 6,397,928 B1 * | 6/2002 | Sterner | ................ | G06F 1/203 165/104.33 |
| 6,397,929 B1 * | 6/2002 | Sterner | ................ | G06F 1/203 165/104.33 |
| 6,397,930 B1 * | 6/2002 | Sterner | ................ | G06F 1/203 165/104.33 |
| 6,400,568 B1 * | 6/2002 | Kim | ................ | G06F 1/20 165/104.33 |
| 6,407,533 B1 * | 6/2002 | Bartek | ................ | H05K 7/20618 320/150 |
| 6,442,024 B1 * | 8/2002 | Shih | ................ | G06F 1/20 165/121 |
| 6,474,409 B1 * | 11/2002 | Sterner | ................ | G06F 1/203 165/185 |
| 6,587,335 B1 * | 7/2003 | Nelson | ................ | G06F 1/20 165/80.3 |
| 6,588,498 B1 * | 7/2003 | Reyzin | ................ | F28D 15/0266 165/104.21 |
| 6,840,311 B2 * | 1/2005 | Ghosh | ................ | F28D 15/0233 165/104.33 |
| 7,120,018 B2 * | 10/2006 | Shen | ................ | G06F 1/20 361/695 |
| 7,209,352 B2 * | 4/2007 | Chen | ................ | H05K 7/20727 165/120 |
| 7,212,403 B2 * | 5/2007 | Rockenfell | ................ | G06F 1/20 165/104.33 |
| 7,215,543 B2 * | 5/2007 | Arbogast | ................ | G06F 1/20 165/121 |
| 7,457,113 B2 * | 11/2008 | Kumhyr | ................ | G06F 1/203 165/80.3 |
| 7,724,516 B2 * | 5/2010 | Harder | ................ | H05K 7/202 211/41.17 |
| 7,872,864 B2 * | 1/2011 | Mongia | ................ | G06F 1/203 361/694 |
| 7,903,404 B2 * | 3/2011 | Tozer | ................ | H05K 7/20827 165/104.21 |
| 7,937,599 B1 * | 5/2011 | Thomas | ................ | G06F 1/206 713/321 |
| 7,961,463 B2 * | 6/2011 | Belady | ................ | H05K 7/20745 312/223.6 |
| 8,029,608 B1 * | 10/2011 | Breslin | ................ | B01D 46/0086 96/421 |
| 8,089,762 B2 * | 1/2012 | Makley | ................ | G06F 1/20 361/679.48 |
| 8,151,578 B1 * | 4/2012 | Morales | ................ | F24F 3/0442 62/259.2 |
| 8,214,086 B2 * | 7/2012 | Thompson | ................ | G06F 1/206 700/275 |
| 8,254,124 B2 | 8/2012 | Keisling | | |
| 8,300,405 B2 * | 10/2012 | Sun | ................ | G06F 1/20 165/185 |
| 8,335,082 B2 * | 12/2012 | Sun | ................ | G06F 1/20 361/679.49 |
| 8,347,952 B2 * | 1/2013 | Ali | ................ | G06F 1/203 165/122 |
| 8,614,892 B2 * | 12/2013 | Chang | ................ | H05K 7/20727 361/690 |
| 8,651,704 B1 * | 2/2014 | Gordin | ................ | F21V 33/006 362/145 |
| 8,814,971 B2 * | 8/2014 | Johnston | ................ | F24F 13/14 55/419 |
| 8,939,827 B2 * | 1/2015 | Boudreau | ................ | F24F 12/006 454/252 |
| 9,301,432 B2 * | 3/2016 | Nelson | ................ | F24F 1/0059 |
| 9,513,678 B2 * | 12/2016 | Moore | ................ | G06F 1/206 |
| 9,862,495 B2 * | 1/2018 | Zywiak | ................ | B64D 13/06 |
| 9,920,950 B2 * | 3/2018 | Ulmanen | ................ | F24F 13/26 |
| 9,969,241 B2 * | 5/2018 | Feltham | ................ | B60H 1/00385 |
| 10,575,443 B2 * | 2/2020 | Woodbury, II | ........ | B62B 5/0026 |
| 2002/0012375 A1 * | 1/2002 | Thompson | ................ | H01S 3/225 372/58 |
| 2002/0024795 A1 * | 2/2002 | Bhatia | ................ | G06F 1/203 361/679.47 |
| 2002/0100577 A1 * | 8/2002 | Wagner | ................ | H01L 23/467 165/80.3 |
| 2002/0179286 A1 * | 12/2002 | Sterner | ................ | F28D 15/02 165/80.3 |
| 2002/0191374 A1 * | 12/2002 | Yatougo | ................ | H05K 7/20145 361/690 |
| 2003/0042003 A1 * | 3/2003 | Novotny | ................ | F25D 19/00 165/47 |
| 2004/0070941 A1 * | 4/2004 | Ghosh | ................ | F28D 15/0266 361/700 |
| 2004/0150951 A1 * | 8/2004 | Yatougo | ................ | H05K 7/20145 361/690 |
| 2005/0030712 A1 * | 2/2005 | Faneuf | ................ | H05K 7/20727 361/679.51 |
| 2005/0036287 A2 * | 2/2005 | Kosugi | ................ | F04D 19/007 361/695 |
| 2005/0174736 A1 * | 8/2005 | Merlet | ................ | H02G 3/04 361/695 |
| 2005/0213306 A1 * | 9/2005 | Vos | ................ | H05K 7/20609 361/714 |
| 2006/0023420 A1 * | 2/2006 | Tucker | ................ | G06F 1/20 361/695 |
| 2006/0061966 A1 * | 3/2006 | Korinsky | ................ | G06F 1/20 361/695 |
| 2006/0087810 A1 * | 4/2006 | Rockenfeller | ............ | G06F 1/20 361/679.47 |
| 2006/0120045 A1 * | 6/2006 | Van Der Werff | ......... | G06F 1/20 361/697 |
| 2006/0123436 A1 * | 6/2006 | Tanaka | ................ | G11B 33/142 720/649 |
| 2007/0074525 A1 * | 4/2007 | Vinson | ................ | H05K 7/20745 62/259.2 |
| 2007/0082601 A1 * | 4/2007 | Desrochers | ............ | F24F 3/044 454/256 |
| 2007/0091565 A1 * | 4/2007 | Malone | ................ | H05K 7/20145 361/695 |
| 2007/0091566 A1 * | 4/2007 | Sun | ................ | G06F 1/20 361/695 |
| 2007/0165377 A1 * | 7/2007 | Rasmussen | .......... | H05K 7/2079 361/695 |
| 2008/0038163 A1 * | 2/2008 | Boege | ................ | B01L 7/52 422/600 |
| 2008/0041077 A1 * | 2/2008 | Tutunoglu | ................ | F25D 19/00 62/186 |

(56) References Cited

U.S. PATENT DOCUMENTS

| | | | |
|---|---|---|---|
| 2008/0174957 A1* | 7/2008 | Lev | G06F 1/203 361/694 |
| 2008/0259566 A1* | 10/2008 | Fried | H05K 7/20809 361/699 |
| 2008/0291625 A1* | 11/2008 | Rathbun, II | H05K 7/2059 361/695 |
| 2008/0291626 A1* | 11/2008 | Nelson | F24F 5/0092 361/696 |
| 2009/0056359 A1* | 3/2009 | Germagian | H05K 7/20836 62/259.2 |
| 2009/0071178 A1* | 3/2009 | Major | H01M 10/613 62/239 |
| 2009/0086434 A1* | 4/2009 | Hodes | H05K 7/20609 361/700 |
| 2009/0183865 A1* | 7/2009 | Miyahara | H01L 23/467 165/177 |
| 2009/0207565 A1* | 8/2009 | Glover | H05K 7/20727 361/688 |
| 2009/0216381 A1* | 8/2009 | Gooch | A62C 3/16 700/277 |
| 2010/0039772 A1* | 2/2010 | Nitta | H01L 23/467 361/697 |
| 2010/0053884 A1* | 3/2010 | Hung | G06F 1/20 361/679.47 |
| 2010/0078157 A1* | 4/2010 | Roth | H05K 7/20745 165/104.34 |
| 2010/0110634 A1* | 5/2010 | Woodbury, II | B62B 5/0026 361/698 |
| 2010/0139908 A1* | 6/2010 | Slessman | F28F 9/0265 165/279 |
| 2011/0105010 A1* | 5/2011 | Day | H05K 7/20754 454/184 |
| 2011/0122580 A1* | 5/2011 | Guan | G06F 1/20 361/695 |
| 2011/0154842 A1* | 6/2011 | Heydari | H05K 7/20836 62/259.2 |
| 2011/0207391 A1* | 8/2011 | Hamburgen | G06F 1/20 454/184 |
| 2011/0259546 A1* | 10/2011 | DeFrancesco | B64D 13/00 165/42 |
| 2011/0317359 A1* | 12/2011 | Wei | F15D 1/0005 361/690 |
| 2012/0037345 A1* | 2/2012 | Yu | F24F 3/0442 165/104.34 |
| 2012/0071082 A1* | 3/2012 | Karamanos | F24F 5/0003 454/284 |
| 2012/0100794 A1* | 4/2012 | Redshaw | H05K 7/207 454/184 |
| 2012/0118327 A1* | 5/2012 | Mazmanyan | B08B 15/00 134/21 |
| 2012/0120542 A1* | 5/2012 | Zhang | H05K 7/20172 361/230 |
| 2012/0243177 A1* | 9/2012 | Pal | F04D 29/545 361/695 |
| 2012/0255715 A1* | 10/2012 | Army | B64D 13/06 165/148 |
| 2012/0309284 A1 | 12/2012 | Dernis | |
| 2013/0040547 A1 | 2/2013 | Moore | |
| 2013/0148284 A1* | 6/2013 | Chang | G06F 1/20 361/679.31 |
| 2013/0155606 A1* | 6/2013 | Sasaki | H01L 23/433 361/679.47 |
| 2013/0213082 A1* | 8/2013 | Woodbury, II | B62B 5/0026 62/498 |
| 2013/0277010 A1* | 10/2013 | Lin | F24F 13/02 165/80.2 |
| 2013/0286587 A1 | 10/2013 | Martini | |
| 2014/0053588 A1* | 2/2014 | Karrat | H05K 7/20836 62/203 |
| 2014/0062392 A1* | 3/2014 | Lofy | H05K 7/20145 320/108 |
| 2014/0083106 A1* | 3/2014 | MacKin | F28F 3/025 60/772 |
| 2014/0096546 A1* | 4/2014 | Hauville | F24F 12/006 62/89 |
| 2014/0102056 A1* | 4/2014 | Johnston | F24F 13/14 55/419 |
| 2014/0133096 A1* | 5/2014 | Campbell | H05K 7/20781 361/694 |
| 2014/0138068 A1* | 5/2014 | Nienberg | H05K 7/20909 165/121 |
| 2014/0141707 A1* | 5/2014 | Carlson | G06F 1/20 454/184 |
| 2014/0260397 A1* | 9/2014 | Agnaou | H02B 1/565 62/259.2 |
| 2014/0332182 A1* | 11/2014 | Taras | H01L 23/36 165/80.3 |
| 2015/0036284 A1* | 2/2015 | Ross | G06F 1/20 361/679.46 |
| 2015/0128483 A1* | 5/2015 | Krupp | F24H 3/025 43/132.1 |
| 2015/0153109 A1* | 6/2015 | Reytblat | H05K 7/2079 62/311 |
| 2015/0166186 A1* | 6/2015 | Zywiak | B64D 13/06 165/279 |
| 2015/0264837 A1* | 9/2015 | Clidaras | H05K 7/20745 165/287 |
| 2015/0271950 A1* | 9/2015 | Hagiwara | H05K 7/206 361/696 |
| 2015/0292751 A1* | 10/2015 | Thompson | F24F 11/0012 236/9 A |
| 2015/0316967 A1* | 11/2015 | MacDonald | G06F 1/203 361/679.49 |
| 2016/0029513 A1* | 1/2016 | Gardner | G06F 1/206 700/276 |
| 2016/0106008 A1* | 4/2016 | Cotton | F24F 5/0007 165/248 |
| 2016/0157386 A1* | 6/2016 | Goulden | H05K 7/20736 700/282 |
| 2016/0183410 A1* | 6/2016 | Rouch | H05K 7/20145 361/695 |
| 2017/0135248 A1* | 5/2017 | Boegner | H05K 7/20736 |
| 2017/0174041 A1* | 6/2017 | Feltham | B60H 1/00385 |
| 2017/0307200 A1* | 10/2017 | Booth | A01G 9/26 |
| 2017/0307242 A1* | 10/2017 | Handsaker | F24F 11/30 |
| 2017/0333820 A1* | 11/2017 | Tuma | G11B 33/1446 |
| 2018/0031264 A1* | 2/2018 | Atchison | F24F 11/30 |
| 2018/0106559 A1* | 4/2018 | Kester | F28F 9/262 |
| 2018/0149386 A1* | 5/2018 | Scaife | F24F 3/044 |
| 2018/0184545 A1* | 6/2018 | Degner | G06F 1/203 |
| 2018/0191043 A1* | 7/2018 | Nelson | H01M 10/613 |
| 2018/0192551 A1* | 7/2018 | Heim | H05K 7/20145 |
| 2020/0006794 A1* | 1/2020 | Trevisan | H01M 8/2475 |

FOREIGN PATENT DOCUMENTS

| | | |
|---|---|---|
| JP | 2006148145 | 6/2006 |
| KR | 100616579 | 8/2006 |
| WO | WO-0190867 | 11/2001 |

OTHER PUBLICATIONS

Kevin Dunlap, "The Advantages of Row and Rack-oriented Cooling Architectures for Data Centers," 2006 American Power Conversion, http://www.datacentres.com/sites/default/files/whitepapers/public/apcWP130.pdf> 8 pps.

PCT/ISA/KR, International Search Report, dated Jun. 29, 2015, PCT/US2014/057949, 10 pps.

\* cited by examiner

FAN CONTROLLED AMBIENT AIR COOLING OF EQUIPMENT IN A CONTROLLED AIRFLOW ENVIRONMENT

BACKGROUND

Controlled airflow environments, such as certain data centers, cellular towers, and the like, can be designed to house a large number of heat generating equipment, such as computer servers, network switches, and other computing devices. Excessive heat within such an environment can, for example, cause electronic components to not perform correctly, corrupt data on the electronic component, or damage the electronic component. In some cases, such environments can rely on air conditioners or other devices to circulate and cool air within the environment.

BRIEF DESCRIPTION OF THE DRAWINGS

For a detailed description of various examples, reference will now be made to the accompanying drawings in which.

DETAILED DESCRIPTION

The following discussion is directed to various examples of the disclosure. Although one or more of these examples may be preferred, the examples disclosed should not be interpreted, or otherwise used, as limiting the scope of the disclosure, including the claims. In addition, the following description has broad application, and the discussion of any example is meant only to be descriptive of that example, and not intended to intimate that the scope of the disclosure, including the claims, is limited to that example. In the following discussion and in the claims, the terms "including" and "comprising" are used in an open-ended fashion, and thus should be interpreted to mean "including, but not limited to . . . ." The term "approximately" as used herein to modify a value is intended to be determined based on the understanding of one of ordinary skill in the art, and can, for example, mean plus or minus 10% of that value.

As described above, excessive heat within certain controlled airflow environments can cause electronic components to not perform correctly, corrupt data on the electronic component, or damage the electronic component. Although such environments can use air conditioners to filter, dehumidify, and cool air within the data center in order to cool sensitive electronic equipment, it may be undesirably expensive or power-intensive to rely on air conditioners alone to cool an entire controlled airflow environment. According to certain implementations described herein, a separate air system can be used to flow ambient air from outside the controlled airflow environment within a sealed ductwork to indirectly cool certain heat generating equipment within the controlled airflow environment. As a result, in some implementations, ambient air containing a large amount of particulate or corrosive matter and/or humid air can be used to assist with cooling since the ambient air is physically isolated from sensitive equipment within the controlled airflow environment. In some implementations, a separate air conditioner can be used to treat air outside of the ductwork according to quality standards for use with sensitive equipment in the controlled airflow environment.

Figure 1:
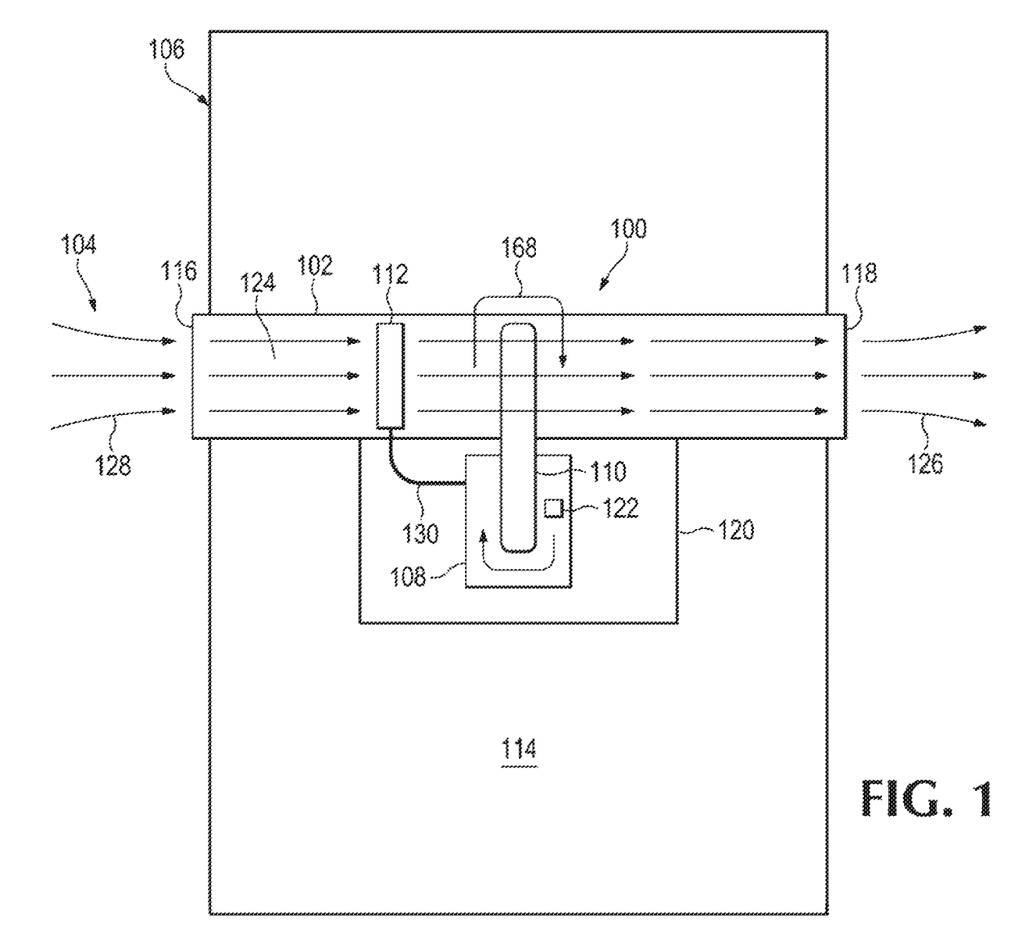
FIG. 1 is a diagram of a system within a controlled airflow environment, according to an example.

FIG. 1 is a diagram of an example system 100 in accordance with principles of this disclosure. As described in further detail below, system 100 includes ductwork 102 to convey ambient air 104 from outside a controlled airflow environment 105 (as depicted with arrows 128 in FIG. 1) to cool heat generating equipment 108 within controlled airflow environment 106. As described in further detail below, system 100 further includes a passive heat exchanger in the form of a thermosiphon 110 connected to equipment 108 and extending into an interior of ductwork 102 so as to circulate a heat transfer medium to cool equipment 108 by exchanging heat between equipment 108 and ambient air 104 in ductwork 102. As described in further detail below, system 100 further includes a fan 112 to flow ambient air 104 through ductwork 102, ultimately emitting ambient air 104 to outside controlled airflow environment 106 (as depicted with arrows 126 in FIG. 1), With fan 112 being connected to equipment 108 to allow equipment 108 to control the operation of fan 112.

In some implementations, system 100 can, for example, be used to leverage outside ambient air and a passive heat exchanger for indirect, yet targeted, cooling of sensitive electronic equipment, such as a computer processor mounted to a circuit board, while allowing circulated air within a controlled airflow environment to directly cool housings, non-electronic components, sealed electronic equipment, or other structures that are less sensitive to particulates, humidity, or other aspects of ambient air. The use of such a system 100, as well as certain other implementations described herein, can work to optimize air usage while minimizing operational costs.

A suitable controlled airflow environment 106 can, for example, include a substantially sealed airspace enclosure designed to house heat generating equipment 108. In some implementations, such environments can be in the form of suitable data center rooms containing networked computing devices and related infrastructure, such as data center servers, switches, etc. In some implementations, such environments are in the form of a room or enclosure for a cellular tower containing one or more telecommunication servers. Such telecommunication servers can, for example, be used to control an antenna or other transmitter, receiver, or transceiver device within the cellular tower, and other receive and process data received by the cellular tower.

In some implementations, controlled airflow environment 106 is completely sealed from air outside the environment. For example, such an environment can be in the form of a "clean room" in which highly sensitive electronics are housed. In same implementations, environment 106 includes one or more removable panels or resealable entry points to allow an operator to access an interior of environment 106. In some implementations, controlled airflow environment 106 may allow for some air from outside the environment to enter environment 106. For example, with reference to an implementation where controlled airflow environment 106 is in the form of a room within a data center, system 100 may be designed to handle a certain amount of air introduced to the room for example due to an open window or open door. As described further below with respect to the system of FIG. 2, in some implementations, the controlled airflow environment can additionally include an air conditioner to treat and circulate air within the environment. As described below, such circulated air can, for example, be treated (e.g., filtered and dehumidified) according to quality standards for use with equipment within the controlled airflow environment.

As described above, in system 100, ambient air 104 flows from outside a controlled airflow environment 106 to indirectly cool heat generating equipment 108 within controlled airflow environment 106 through the use of a passive heat exchanger in the form of a thermosiphon 110. In some controlled airflow environments 106, air that interacts with sensitive electronic equipment may be subject to certain standards, such as standards related to cleanliness, humidity, or temperature. However, system 100 is designed such that ambient air 104 does not come into direct contact with equipment 108. Instead, ambient air 104 is used to cool equipment 108 via the use of a passive heat exchanger, which can be in the form of a thermosiphon 110 designed to interact with untreated ambient air 104. The use of such untreated ambient air can result in decreased energy costs for operating equipment 108 within controlled airflow environment 106. For example, energy that would be used by controlled airflow environment 106 for filtering, dehumidifying, and cooling air may be stored or used for other purposes within controlled airflow environment 106. Although the term "ambient air" is used for description, it is appreciated, that in some implementations, the ambient air may be treated before or after contacting the passive heat exchanger. For example, ambient air 104 can be cooled by a chiller or filtered by a filter within ductwork 102 (see, e.g., the system of FIG. 2 for one such implementation).

Controlled airflow environment 106 further includes air 114 outside of ductwork 102. Air 114 can, for example, be treated (e.g., filtered and dehumidified) according to quality standards for use with equipment 108 within controlled airflow environment 106. For example, in some implementations, controlled airflow environment 106 can include multiple air systems, such as a first air system (e.g., system 100) that relies on ambient air 104 for cooling certain equipment 108 within controlled airflow environment 106 and a second air system that relies on circulated, filtered, dehumidified, and chilled air 114 for cooling other equipment within controlled airflow environment 106. One example of such a system is described and illustrated below with respect to FIG. 2. In some implementations, controlled airflow environment 106 may be designed so as not to rely on recirculation of air 114 or to recirculate just a portion of air 114. For example, in some implementations, air 114 outside of ductwork 102 may initially pass through an air conditioning system to treat the air. Air 114 outside of ductwork 102 can, for example, be provided to controlled airflow environment 106 at a positive pressure such that the air is pressurized to flow through open windows, doorways, vents, or other openings within controlled airflow environment 106.

As described above, system 100 includes ductwork 102, which can be designed to convey ambient air 104 from outside controlled airflow environment 106 and emit ambient air 104 to outside controlled airflow environment 106. In some implementations, ductwork 102 is sealed so as to completely separate ambient air 104 from air 114 in controlled airflow environment 106. Ductwork 102 can be made of any suitable material or combination of materials, such as for example suitable galvanized steel, aluminum, fiberglass, combinations thereof, etc. Ductwork 102 may be made of a suitably rigid or flexible material based on desired ducting characteristics of system 100.

As depicted for example in the diagram of system 100 of FIG. 1, in some implementations, ductwork 102 may extend horizontally throughout controlled airflow environment. It is appreciated, however, that ductwork 102 may extend vertically through controlled airflow environment, which can, in same implementations, provide for a chimney effect to facilitate flow of ambient air 104 through ductwork 102. In some implementations, ductwork 102 is installed diagonally through controlled airflow environment 106. Although ductwork 102 is depicted in controlled airflow environment 106 as extending in a single horizontal direction, it is appreciated that certain implementations can include non-straight ductwork 102, such as ductwork with one or more curves, bends, or corners. The path of ductwork 102 can, for example, be designed to curve around structures within controlled airflow environment 106.

System 100 includes an inlet opening 116 to supply ambient air 104 from outside controlled airflow environment 106 to ductwork 102 and an exhaust opening 118 to emit ambient air 104 from ductwork 102 to outside controlled airflow environment 106. In some implementations, inlet and exhaust openings 116 and 118 can be in the form of respective openings within a wall or other surface of controlled airflow environment 106. In some implementations, such a wall or other surface of controlled airflow environment 106 can include a reinforcing structure that is designed to be coupled to ductwork 102 to align and support ductwork 102. In some implementations, ductwork 102 can pass through such an opening of controlled airflow environment 106 so as to be aligned and supported by the opening. In some implementations, inlet and exhaust openings 116 and 118 can, for example, include vents or other structures to restrict or redirect ambient air 104 through system 100. In some implementations, inlet and exhaust openings 116 and 118 can be coupled to a panel, door, or other structure to close off the openings when system 100 is not in use.

As described above, system 100 can be used to cool heat generating equipment 108 within controlled airflow environment 106. Equipment 108 can be in the form of any suitable equipment that can generate heat. As but one example, equipment 108 can be in the form of electrical equipment that generates heat due to electrical resistance from electrical current. Equipment 108 can, for example, be in the form of a processor, memory, storage device, network switch, I/O controller, network interface card (NICS), Peripheral Component Interconnect (PCI) card, server, any suitable heat generating component thereof.

In some implementations, equipment 108 can include an equipment housing 120 to secure equipment 108 within system 100. In some implementations, equipment housing 120 can be in the form of a housing made of plastic, metal, or another suitable material that includes openings for one or more buttons to allow an operator to interact with equipment 108. In implementations where equipment 108 is in the form of a computer server or component thereof, equipment housing 120 can, for example, be in the form of a computer server housing (see, e.g., the implementation depicted in FIG. 3). Equipment housing 120 can, for example, include vents or other airway openings to allow air circulated within controlled airflow environment 106 to cool equipment 108.

In some implementations, equipment 108 can include a temperature sensor 122 that can enable equipment 108 or another computing device to determine the temperature of equipment 108. Temperature sensor 122 can, for example, be integrated with equipment 108 or can be a discrete component coupled to equipment 108. As described further below, temperature sensor 122 can be coupled to a processor on equipment 108 to allow equipment 108 to control the operation of fan 112 based on readings from temperature sensor 122.

As described above, system 100 includes a passive heat exchanger, which in some implementations is in the form of a thermosiphon 110 connected to equipment 108 and extending into an interior of ductwork 102 so as to circulate a heat transfer medium to cool equipment 108 by exchanging heat between equipment 108 and ambient air 104 in ductwork 102. The heat transfer medium can, for example, be circulated along circulation path 168. Suitable heat transfer mediums can, for some implementations, include fluids with low boiling temperatures. The selection of a suitable heat transfer medium can, for example, be based on expected operating temperatures for equipment 108. In some implementations, thermosiphon 110 can include a first portion thermally coupled to equipment 108 and a second portion extending into an interior channel 124 of ductwork 102. In such implementations, thermosiphon 110 circulates the heat transfer medium within an interior of the thermosiphon between the first portion and the second portion to cool equipment 108 by exchanging heat between equipment 108 and ambient air 104 in interior channel 124 of ductwork 102.

Thermosiphon 110 can, for example, be in the form of a closed loop to allow the heat transfer medium to circulate around the closed loop. Thermosiphon 110 can, for example, rely on thermodynamic properties of the heat transfer medium to provide for passive heat exchange based on convection to circulate the heat transfer medium without the use of a mechanical pump. For example, in some implementations, the heat transfer medium can be circulated through thermosiphon 110 when the heat transfer medium at a bottom of thermosiphon 110 is heated by equipment 108, which causes the heat transfer medium to expand and become less dense. The heated medium can then be moved upwards in the loop via convection, with heat transfer medium cooled by ambient air 104 at the top of the loop in thermosiphon 110 in turn moving to the bottom of thermosiphon 110 to replace the heated medium. Ambient air 104 (now with heat discharged by equipment 108) continues to pass through interior channel 124 of ductwork 102 and is ultimately emitted from exhaust opening 118 as indicated by arrows 126. The thermosiphon can thereby act as a heat exchanger to transfer heat generated by equipment 108 to ambient air 104, while allowing equipment 108 to be separated from direct physical contact with ambient air 104.

Although many implementations of systems described herein refer to the use of thermosiphons as suitable passive heat exchangers, it is appreciated that other forms of passive heat exchangers may be used. For example, in some implementations the passive heat exchanger may be in the form of a solid state device or other suitable device that can transfer heat from equipment 108 to ambient air 104 without requiring a mechanical energy input. For example, passive heat exchangers can include devices that rely on thermal differences between equipment 108 and ambient 104 to drive heat from equipment 108 and ambient air 104. The use of passive heat exchangers can, in some situations, reduce energy inputs of air systems and can be contrasted with other types of heat exchangers, such as pump-driven heat exchangers, that rely on outside energy sources. In some implementations, the passive heat exchanger can be in the form of a suitable vapor chamber or heat pipe designed to exchange heat between equipment 108 and ambient air 104 while otherwise isolating equipment 108 from ambient air 104. It is appreciated that aspects described herein relating to the use of design of thermosiphon 110 can be applicable to other types of passive heat exchangers.

In some implementations, multiple thermosiphons 110 can be connected to a single or multiple pieces of equipment 108 to allow for additional heat exchange. For example, a first thermosiphon 110 can be connected to a first heat generating processor on equipment 108 and a second thermosiphon 110 can be connected to a second heat generating processor on equipment 108. Likewise, a first thermosiphon 110 can be connected to a first piece of equipment 108 within system 100 and a second thermosiphon 110 can be connected to a second piece of equipment 108 within system 100. In such implementations, a portion of each thermosiphon 110 can extend into an interior of ductwork 102 to circulate a heat transfer medium within each respective thermosiphon 110 to cool multiple pieces of equipment 108 or multiple heat generating components on a single piece of equipment 108 by exchanging heat with ambient air 104 in ductwork 102. One example of such an implementation is described below with respect to FIGS. 3-5.

As described above, system 100 includes fan 112 to flow ambient air 104 through ductwork 102. Fan 112 is connected to equipment 108 via connection 130 to allow equipment 108 to control operation of fan 112. Connection 130 can, for example, be in the form of a wired or wireless connection that allows signals relating to operation of fan 112 to be passed from equipment 108 to fan 112. For example, in some implementations, connection 130 can be in the form of a wired data cable connected at a first end to equipment 108 and at a second end to fan 112. In some implementations, connection 130 can provide electrical power to operate fan 112, whereas in other implementations, fan 112 can be independently powered. In some implementations, fan 112 can be positioned at any suitable location within ductwork 102 to flow ambient air 104. For example, in some implementations, fan 112 can be positioned upstream of thermosiphon 110 to "push" air past thermosiphon 110. One example of such an implementation is depicted in FIG. 1. In some implementations, fan 112 may be positioned downstream of thermosiphon 110 to "pull" air past thermosiphon 110. In some implementations, multiple fans 112 are used in system 100. For example, a first fan 112 can be located upstream of thermosiphon 110 and a second fan 112 can be located downstream of thermosiphon 110.

Figure 2:
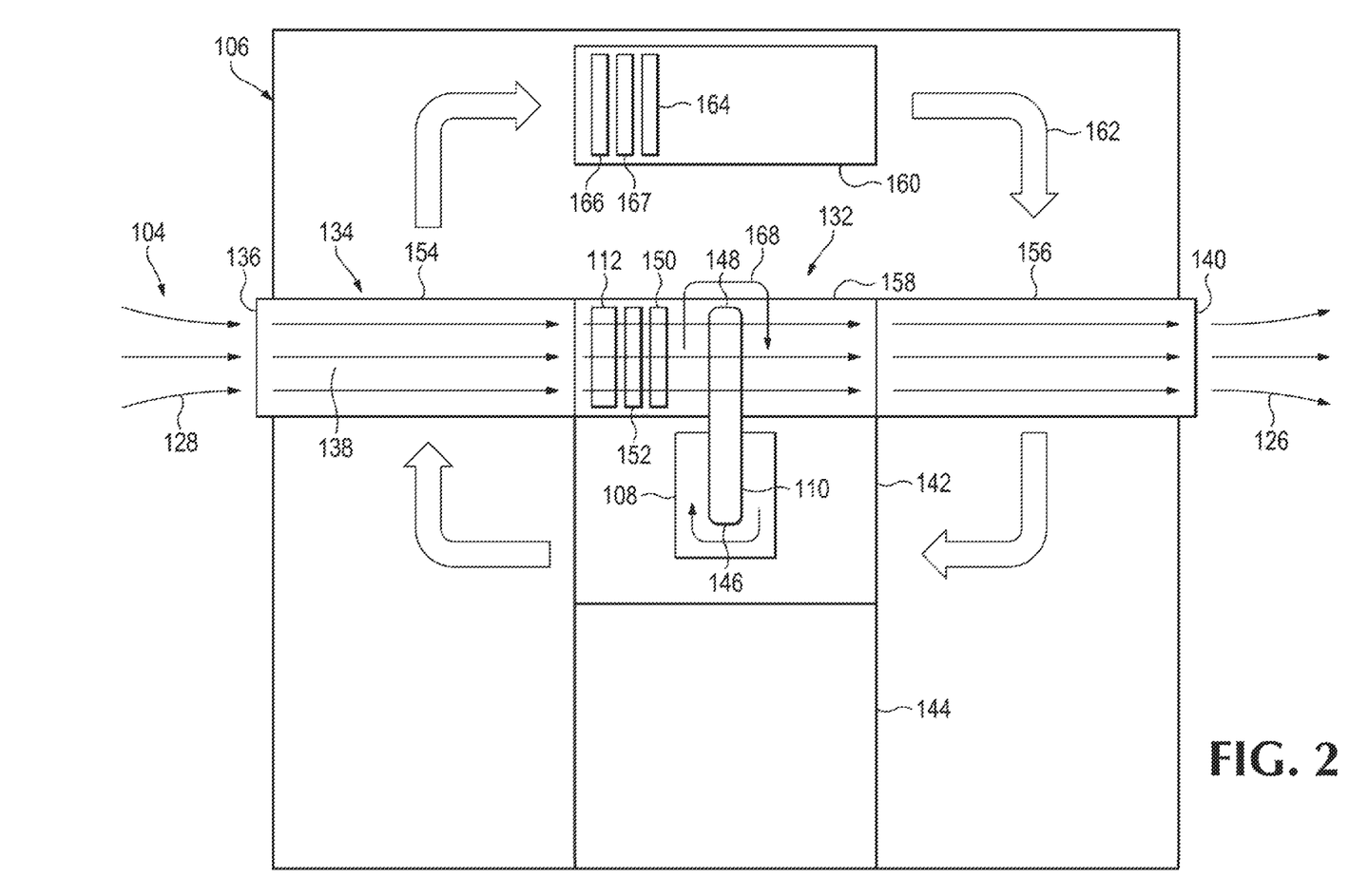
FIG. 2 is a diagram of a system within a controlled airflow environment, according to another example.

FIG. 2 illustrates a system 132 in accordance with another implementation. For illustration, several elements of system 100 of FIG. 1 are used to describe system 132. It is appreciated, however, that one or more structural or functional aspects or components of other systems described herein can be implemented in system 132 and vice versa. Similar to certain implementations of ductwork 102 of system 100, ductwork 134 of system 132 seals ambient air 104 from air 114 within controlled airflow environment 106 outside of ductwork 134. For example, similar to certain implementations of system 100, ductwork 134 cam (1) receive, through an inlet opening 136 in controlled airflow environment 106, ambient air 104 from outside controlled airflow environment 106, (2) pass ambient air 104 through an interior channel 138 of ductwork 134, and (3) emit ambient air 104 to outside controlled airflow environment 106 through an exhaust opening 140 formed in controlled airflow environment 106.

Similar to certain implementations of system 100 of FIG. 1, system 132 includes an electrical computing device 142 with heat generating equipment 108. Electrical computing device 142 can, for example, be in the form of a rack-mounted server supported by a server rack 144. It is appreciated that in other implementations, electrical computing device 142 can be supported by another suitable support. Similar to certain implementations of system 100 of FIG. 1, system 132 includes a thermosiphon 110 including a first portion 146 thermally coupled to heat generating equipment 108 and a second portion 148 extending into interior channel 138 of ductwork 134. Thermosiphon 110 can circulate a heat transfer medium within an interior of the thermosiphon 110 between first portion 146 and second portion 148 to cool equipment 108 by exchanging heat between equipment 108 and ambient air 104 in interior channel 138 of ductwork 134. Similar to certain implementation of system 100 of FIG. 1, system 132 includes a fan 112 to flow ambient air 104 through ductwork 134, with the operation of fan 112 being controlled by equipment 108 based on a temperature of equipment 108.

System 132 includes a filter 150 to filter ambient air 104 within ductwork 134. Filter 150 can, for example, be in the form of a device composed of fibrous materials designed to remove solid particulates such as dust, pollen, mold, and bacteria from ambient air 104. In some implementations, filter 150 can, for example, be in the form of a chemical air filter that includes an absorbent or catalyst for the removal of airborne molecular contaminants. Filter 150 can be positioned at any suitable location within ductwork 134 to filter ambient air 104. For example, in some implementations, filter 150 can be positioned upstream or downstream of thermosiphon 110. In some implementations, multiple filters 150 are used within ductwork 134.

System 100 includes a chiller 152 positioned upstream of thermosiphon 110 in ductwork 134 to cool ambient air 104 within ductwork 134 before ambient air 104 reaches thermosiphon 110. Chiller 152 can, for example, be suitable for use where ambient air 104 is at too high of a temperature to effectively transfer heat to thermosiphon 110 to cool equipment 108. In some implementations, chiller 152 can be designed to circulate chilled water to coils or other heat exchanging structures to cool air within chiller 152. Such heat exchanging structures within chiller 152 can transfer sensible heat and latent heat from the air within chiller 152 to the chilled water to cool and, in some cases, dehumidify air within chiller 152. In some implementations, chiller 152 can be designed to use a refrigerant, such as R410a, R407c, and R134a, as a working fluid.

Similar to system 100 of FIG. 1 described above, controlled airflow environment 106 can, for example, be in the form of a substantially sealed airspace enclosure designed to house heat generating equipment such as equipment 108. In some implementations, such as the implementation of system 100 depicted in FIG. 1, ductwork of system 132 can be directly connected to an interior opening 136 and exhaust opening 140 of controlled airflow environment 106. However, in some implementations, for example as depicted in the implementation of FIG. 2, controlled airflow environment 106 can include a first portion 154 of ductwork 134 to connect to an upstream side of a system ductwork 158, and a second portion 156 of ductwork 134 to connect to a downstream side of system ductwork 158. First portion 154 and second portion 156 of ductwork 134 can, for example, be installed within controlled airflow environment 106 and then separately installed to system ductwork 158. During such an installation process, first portion 154 and/or second portion 148 of ductwork 134 can be sized based on the length of system ductwork 158 and the length between inlet opening 136 and exhaust opening 140 of controlled airflow environment 106.

It is appreciated that one or more portions of ductwork within system 132 can include multiple segments coupled together to form a single ductwork segment having an interior channel. As but one example, first portion 154 of ductwork 134 can be formed from two separate sub-portions fixed together to form a single "first portion" of ductwork 134 having a continuous interior channel 138. In some implementations, each ductwork segment is substantially straight and forms a substantially straight interior channel 138. However, it is appreciated that in some implementations, certain segments may be curved or multiple segments can be joined at an angle to provide for a non-straight interior channel 138. It is appreciated that certain components described above, such as filter 150 and chiller 152 may be positioned within first portion 154 or second portion 156 of ductwork 134 rather than within system ductwork 158. As an example, in some implementations, filter 150 can be provided within first portion 154 of ductwork 134.

In some implementations, system 132 can include an air conditioner 160 to condition air 114 in controlled airflow environment 106 outside of ductwork 134. Air conditioner 160 can, for example, be used to filter, circulate (e.g., along circulation path 162), and cool air 114 within controlled airflow environment 106 to specified office or work area settings. Air conditioner 160 can, for example, include a chiller 164 for cooling air 114 in controlled airflow environment 106 outside of ductwork 134. Chiller 164 of air conditioner 160 can include one or more aspects of chiller 152 described above for chilling ambient air 104. In some implementations, air conditioner 160 can include a filter 166, which can, for example, be used to remove particulates in air 114 in controlled airflow environment 106 outside of ductwork 134. Filter 166 of air conditioner 160 can include one or more aspects of filter 150 described above for filtering ambient air 104. In some implementations, air conditioner 160 can include a dehumidifier 167, which can, for example, be used to extract water from air 114 in controlled airflow environment 106 outside of ductwork 102.

Figure 3:
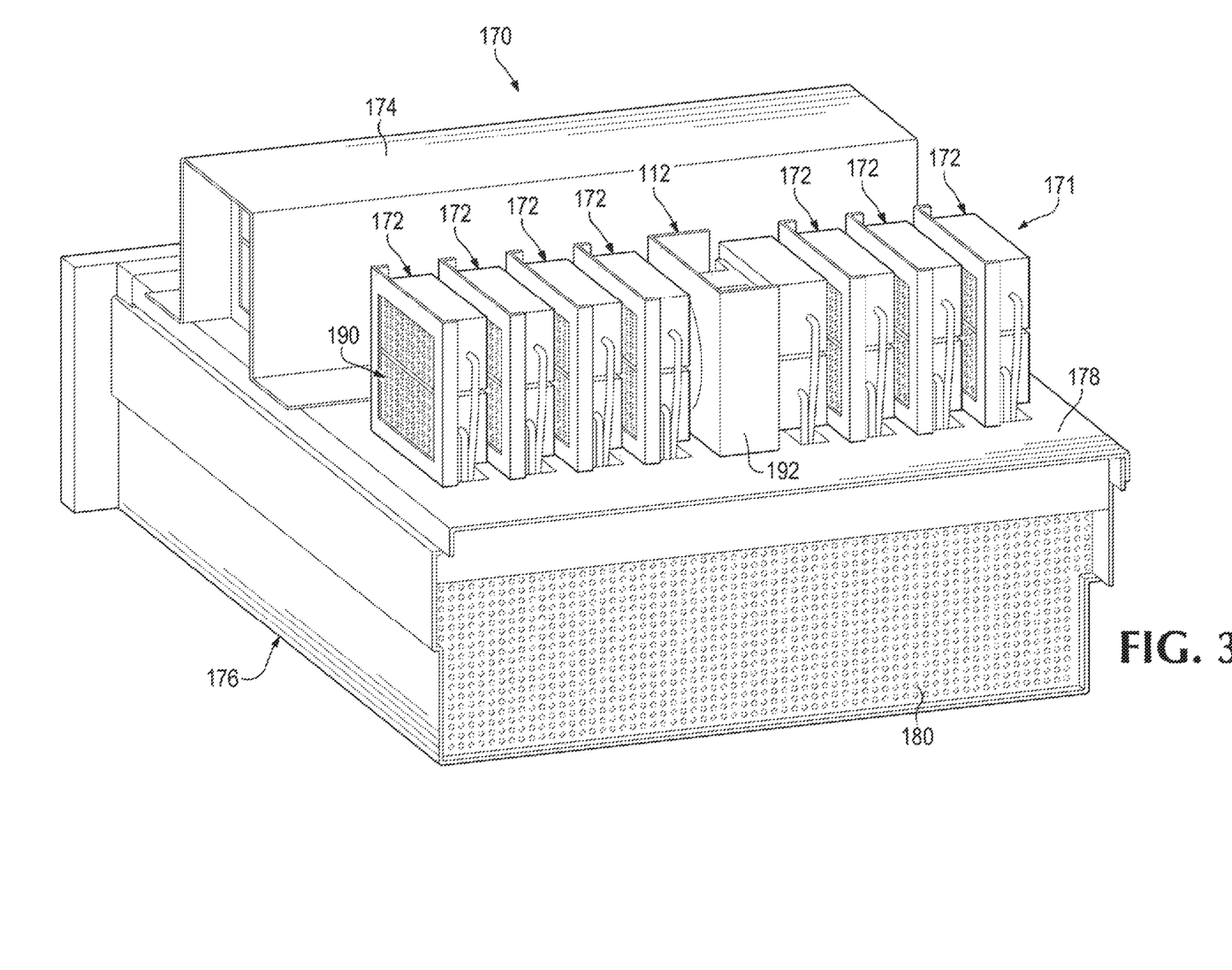
FIG. 3 is a front perspective view of a system with a portion of ductwork removed, according to another example.
Figure 4:
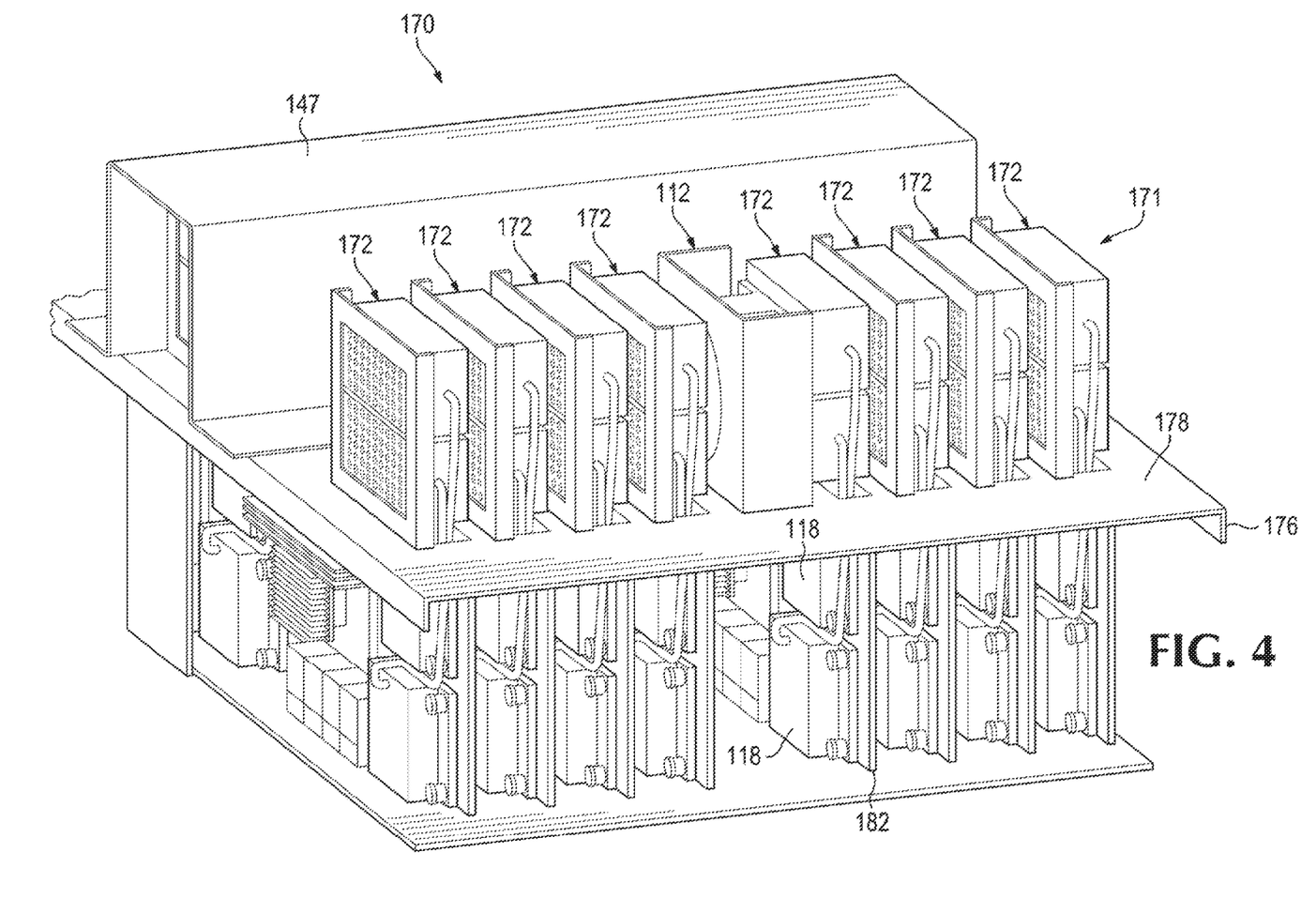
FIG. 4 is a front perspective view of a system with a portion of ductwork and equipment housing removed, according to an example.
Figure 5:
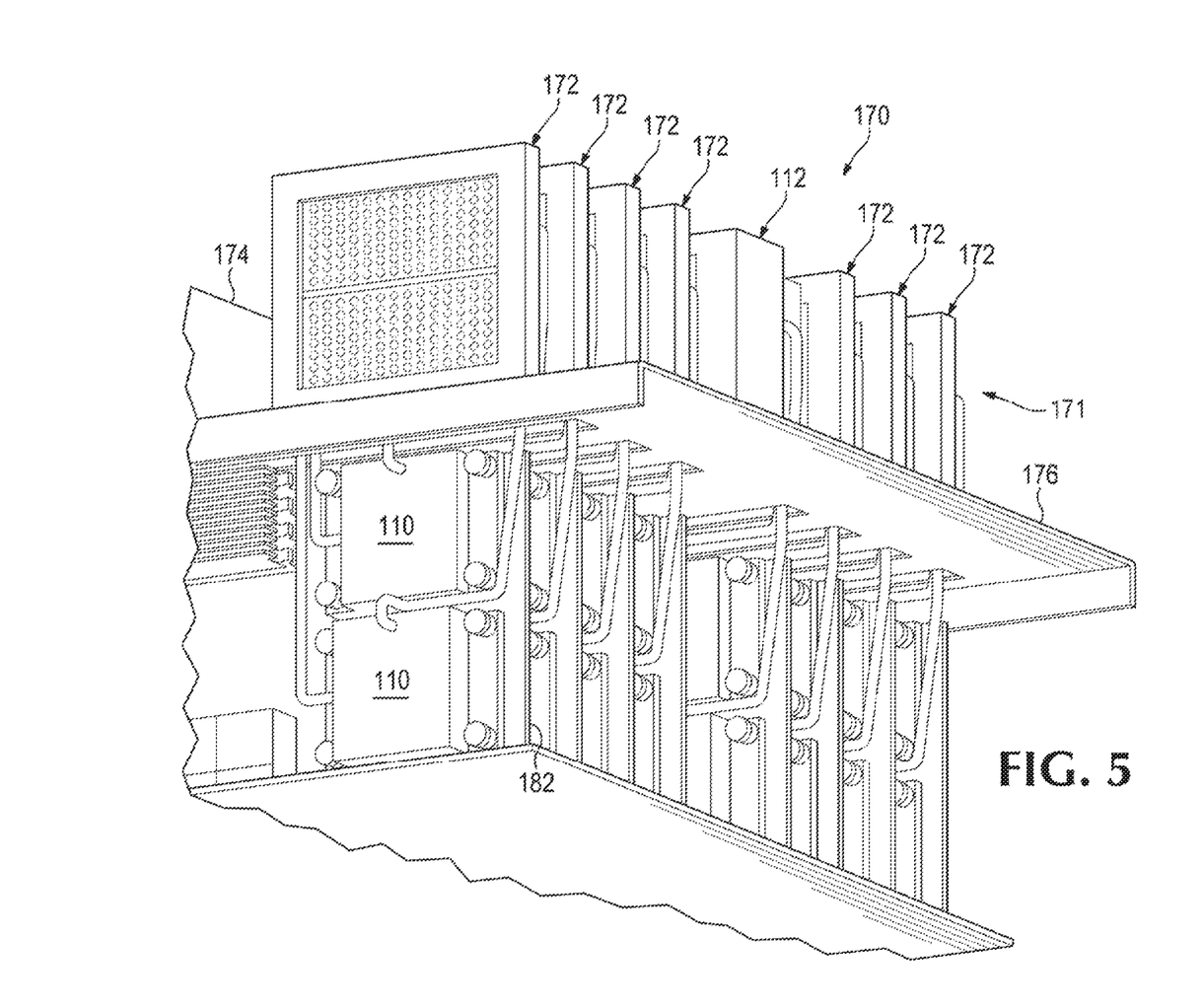
FIG. 5 is a bottom perspective of a system with a portion of ductwork and equipment housing removed, according to an example.
Figure 6:
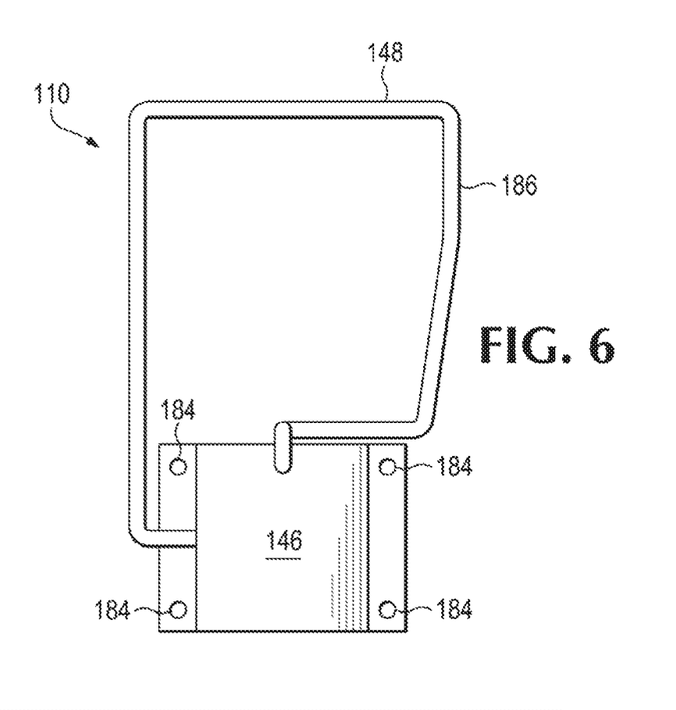
FIG. 6 is a front view of a thermosiphon, according to an example.

FIGS. 3-6 illustrate an example system 170 and components thereof, according to a specific implementation. In particular, FIG. 3 illustrates a front perspective view of system 170 including two rows of eight thermosiphon assemblies 172 with ductwork 174 covering a first row of thermosiphon assemblies 172 and with ductwork of the second row of thermosiphon assemblies 172 removed for illustration, FIG. 4 illustrates another front perspective view of system 170 with portions of equipment housing 176 removed for illustration, FIG. 5 illustrates a bottom perspective view of system 170 with portions of equipment housing 176 removed for illustration, and FIG. 6 illustrates a thermosiphon 110 for use with system 170. For illustration, several elements of system 100 of FIG. 1 are used to describe system 170. It is appreciated, however, that one or more structural or functional aspects or components of other systems described herein can be implemented in system 170 and vice versa.

In this implementation, system 170 is in the form of a telecommunication server for use in a cellular tower. System 170 includes two parallel pieces of ductwork 174 that couple with an upper surface 178 of equipment housing 176 to form respective interior channels through which ambient air 104 can pass. An array 171 of eight thermosiphon assemblies 172 extend above upper surface 178 of equipment housing 176 into the interior channels formed by ductwork 174. Equipment housing 176 includes ventilation holes 180 through which non-ambient air within controlled airflow environment 106 can pass to cool portions of equipment 108 housed without equipment housing 176. That is, in this implementation, ambient air 104 within ductwork 174 (and sealed from the rest of controlled airflow environment 106) is used to indirectly cool equipment 108 via thermosiphon assemblies 172, whereas air outside of ductwork 174 (which can, for example, be cooled, filtered, dehumidified, or otherwise treated by a separate air conditioner) is used to directly cool other portions of system 170. Such a system can, in some implementations, allow system 170 to leverage "dirty" ambient air 104 to assist in cooling components of system 170 without worrying about ambient air 104 contaminating or otherwise interfering with operation of sensitive electronic equipment 108, while relying on a separate air conditioner to cool other components of system that are not indirectly cooled by thermosiphon assembly 172.

As best shown in FIGS. 4 and 5 (in which a portion of equipment housing 176 is removed for illustration), each thermosiphon assembly 172 includes an upper thermosiphon 110 and a lower thermosiphon 110, with each thermosiphon assembly 172 being positioned over a respective computer processor (or other heat generating equipment) mounted to a circuit board 182. For further illustration, FIG. 6 depicts an example thermosiphon 110 for use with system 170. In this implementation, each thermosiphon 110 includes a first portion 146 designed to be thermally coupled to a heat generating portion of equipment 108. First portion 146 can, for example, include a substantially flat surface that mates with a corresponding flat surface of equipment 108. In some implementations, first portion 146 can substantially cover and seal off equipment 108 from Thermosiphon 110 can further include one or more mounting holes 184 to secure thermosiphon 110 to equipment 108 or another structure of system 170 (e.g., to circuit board 182). Thermosiphon 110 further includes tubing 186 that extends from first portion 146 to a second portion 148 to form a circuit for circulating heat transfer medium through thermosiphon 110. As described above, ambient air 104 flows past second portion 148 to remove heat from thermosiphon 110.

In this implementation, each thermosiphon assembly 172 includes a housing 188 (not shown in FIG. 6) to secure and position each thermosiphon 110 within ductwork 174. Each housing 188 further includes baffles 190 to increase the efficiency of heat transfer between ambient air 104 and thermosiphon 110. In this implementation, fan 112 is positioned between thermosiphon assemblies 172 and includes a housing 192 that is designed to force air to pass through spinning blades of fan 112 to increase the efficiency of fan 112.

Figure 7:
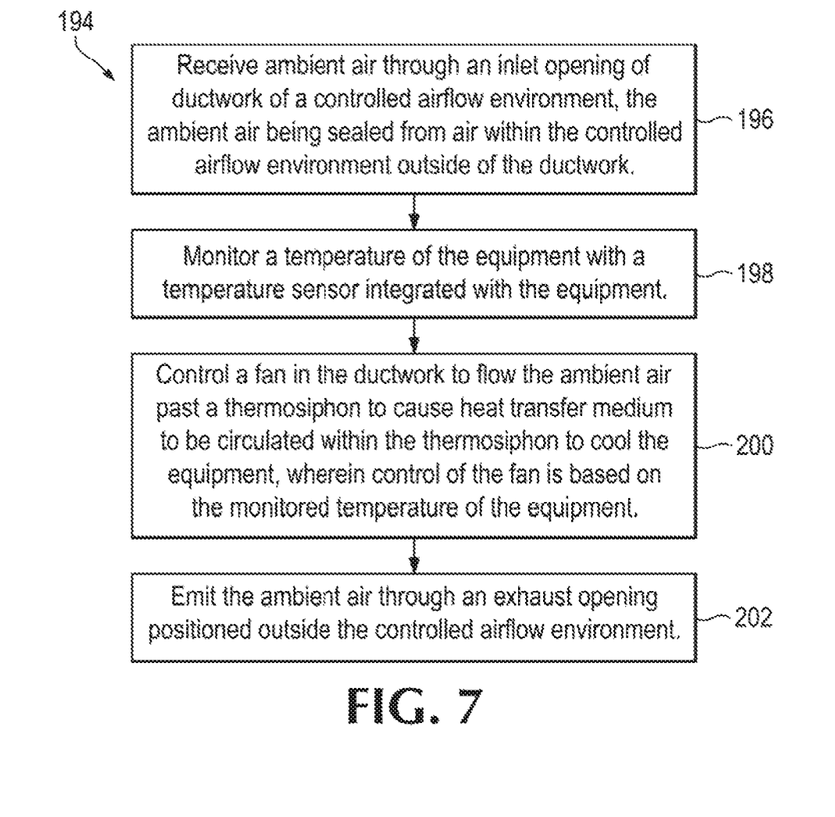
FIG. 7 is a flowchart of a method, according to an example.

FIG. 7 illustrates a flowchart for a method 194 relating to the use of an improved cooling system 100 using ambient air 104. For illustration, several elements of system 100 of FIG. 1 are used to describe method 194. It is appreciated, however, that one or more structural or functional aspects or components of other systems described herein can be used with method 194 and vice versa. Method 194 includes a step 196 of receiving ambient air 104 in ductwork 102 through an inlet opening 116 positioned outside of a controlled airflow environment 106. Arrows 128 of FIG. 1 depict one example of an intake path for ambient air 104

Ductwork 102 is designed such that ambient air 104 is sealed from air 114 within controlled airflow environment 106. Ambient air 104 can sucked into ductwork 102 from outside controlled airflow environment 106 due to a pressure differential by fan 112 or another device positioned within ductwork 102. In some implementations, temperature differences between ambient air 104 outside of controlled airflow environment and air within ductwork 102 can force ambient air 104 into ductwork 102. In some implementations, a fan 112 or other air blowing device is positioned upstream of ductwork 102 and outside of controlled airflow environment 106 to blow ambient air 104 into ductwork 102.

Method 194 includes a step 198 of monitoring a temperature of equipment with a temperature sensor 122 integrated with equipment 108. Temperature sensor 122 can, for example, monitor equipment 108 through the use of periodic or semi-periodic readings. Method 194 further includes a step 200 of controlling fan 112 in ductwork 102 to flow ambient air 104 past a passive heat exchanger in the form of a thermosiphon 110 to cause heat transfer medium to be circulated within thermosiphon 110 to regulate the temperature of equipment 108 within controlled airflow environment 106. In some implementations, thermosiphon 110 includes a first end (e.g., corresponding to first portion 146) that is thermally coupled to equipment 108 and a second end (e.g., corresponding to second portion 148) that extends into ductwork 102. In some implementations, control of fan 112 is based on the temperature of the equipment monitored by temperature sensor 122. Method 194 further includes a step 202 of emitting ambient air 104 through exhaust opening 140 and to outside controlled airflow environment 106. Arrows 126 of FIG. 1 depict one example of an exhaust path for ambient air 104. In some implementations, all of ambient air 104 that is received through inlet opening 116 is emitted through exhaust opening 140. However, in other implementations, less than all of the ambient air 104 that is received through inlet opening 136 is emitted through exhaust opening 140. For example, in some implementations, a portion of ambient air 104 can be exhausted through a suitable outlet of ductwork 102 into controlled airflow environment 106 or another device of controlled airflow environment 106.

As described above, certain implementations of systems described herein (e.g., system 132) can include air conditioner 160. In such implementations, method 194 can include a step of receiving, with air conditioner 160, air 114 in controlled airflow environment 106 outside of ductwork 102. In such implementations, method 194 can further include filtering air 114 received with air conditioner 160 to remove particulates in air 114 and flowing the filtered air 114 to controlled airflow environment 106 outside of ductwork 102. In some implementations, ductwork 102 can include one way valves or other devices to receive air 114 from within controlled airflow environment 106 while preventing ambient air 104 from being emitted outside of ductwork 102, Although the flowchart of FIG. 7 and description of method 194 identify one order of performance, it is appreciated that this order may be rearranged into another suitable order, may be executed concurrently or with partial concurrence, include additional or comparable steps to achieve the same or comparable functionality, or a combination thereof.

While certain implementations have been shown and described above, various changes in form and details may be made. For example, some features that have been described in relation to one implementation and/or process can be related to other implementations. In other words, processes, features, components, and/or properties described in relation to one implementation can be useful in other implementations. Furthermore, it should be understood that the systems, apparatuses, and methods described herein can include various combinations and/or sub-combinations of the components and/or features of the different implementations described. Thus, features described with reference to one or more implementations can be combined with other implementations described herein.

The choice of materials for the parts described herein can be informed by the requirements of mechanical properties, temperature sensitivity, moldability properties, or any other factor apparent to a person having ordinary skill in the art. For example, one more of the parts (or a portion of one of the parts) can be made from suitable plastics, metals, and/or other suitable materials.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system comprising:
    an enclosure defining a controlled airflow environment isolated from an exterior environment such that controlled air in the controlled airflow environment is isolated from ambient air outside the controlled airflow environment and the controlled air is treated by an air conditioner;
    ductwork defining an interior channel exposed to the ambient air via an intake opening and an exhaust opening and isolated from the controlled airflow environment such that the ambient air in the interior channel is isolated from the controlled air inside the controlled airflow environment;
    a passive heat exchanger connected to equipment within the controlled airflow environment and extending into the interior channel of the ductwork to exchange heat between the equipment and the ambient air in the ductwork such that the ambient air does not come into direct contact with the equipment; and
    a fan to flow the ambient air through the ductwork, the fan connected to the equipment to allow the equipment to control the operation of the fan based, in part, on a temperature of the equipment,
    wherein cooling of the equipment is performed utilizing both of the controlled air from the controlled airflow environment and the ambient air flowing through the ductwork.

2. The system of claim 1, wherein the passive heat exchanger includes a thermosiphon connected to the equipment and extending into the interior channel of the ductwork to circulate a heat transfer medium to cool the equipment by exchanging heat between the equipment and the ambient air in the ductwork.

3. The system of claim 1, further comprising:
    a filter to filter the ambient air within the ductwork.

4. The system of claim 1, further comprising:
    a chiller positioned upstream of the heat exchanger in the interior channel of the ductwork to cool the ambient air in the interior channel before it reaches the heat exchanger.

5. The system of claim 1, wherein the air conditioner includes a chiller to cool the controlled air in the controlled airflow environment outside of the ductwork.

6. The system of claim 1, wherein the air conditioner includes a filter to remove particulates in the controlled air in the controlled airflow environment outside of the ductwork.

7. The system of claim 1, wherein the air conditioner includes a dehumidifier to extract water from the controlled air in the controlled airflow environment outside of the ductwork.

8. The system of claim 1, wherein the air conditioner is to circulate the air in the controlled airflow environment outside of the ductwork.

9. The system of claim 1, further comprising:
    ductwork upstream of the ductwork defining the interior channel of the system; and
    ductwork downstream of the ductwork defining the interior channel of the system.

10. The system of claim 1, further comprising multiple thermosiphons connected to multiple pieces of equipment that each extend into the interior of the ductwork to circulate a heat transfer medium to cool a respective one of the multiple pieces of equipment by exchanging heat between the multiple pieces of equipment and the ambient air in the interior channel.

11. A method comprising:
    receiving ambient air through an inlet opening of an interior channel of ductwork of a controlled airflow environment, the ambient air being sealed from controlled air within the controlled airflow environment outside of the ductwork and being physically isolated from the equipment within the controlled airflow environment, the controlled air treated by an air conditioner;
    monitoring a temperature of the equipment with a temperature sensor integrated with the equipment;
    controlling a fan in the interior channel of the ductwork to flow the ambient air past a passive heat exchanger to cool the equipment, wherein the heat exchanger includes a first end that extends into the interior channel of the ductwork and a second end that extends outside of the ductwork and that is thermally coupled to the equipment, and wherein control of the fan is based on the monitored temperature of the equipment; and
    emitting the ambient air through an exhaust opening and to outside the controlled airflow environment,
    wherein cooling of the equipment is performed utilizing both of the controlled air from the controlled airflow environment and the ambient air flowing through the interior channel of the ductwork.

12. The method of claim 11, further comprising:
    receiving, with the air conditioner, the controlled air from within the controlled airflow environment outside of the ductwork;
    filtering the received controlled air with the air conditioner to remove particulates in the controlled air; and
    flowing the filtered controlled air to the controlled airflow environment outside of the ductwork.

13. A system comprising:
    an enclosure defining a controlled airflow environment isolated from an exterior environment such that controlled air in the controlled airflow environment is isolated from ambient air outside the controlled airflow environment and the controlled air is processed by a first system to treat and maintain the controlled airflow environment;
    ductwork defining an interior channel exposed to the ambient air via an intake opening and an exhaust opening, the interior channel being isolated from the controlled airflow environment such that the ambient air in the interior channel is isolated from the controlled air inside the controlled airflow environment;

an electrical computing device including heat generating equipment, the electrical computing device being located within the controlled airflow environment;

a thermosiphon including a first portion thermally coupled to the heat generating equipment and a second portion extending into the interior channel of the ductwork, the thermosiphon to circulate a heat transfer medium within an interior of the thermosiphon between the first portion and the second portion to cool the equipment by exchanging heat between the equipment and the ambient air in the interior channel of the ductwork such that the ambient air does not come into direct contact with the equipment; and a fan to flow the ambient air through the interior channel of the ductwork, the operation of the fan being controlled by the equipment based on a temperature of the equipment, wherein cooling of the equipment is performed utilizing both of the controlled air from the controlled airflow environment and the ambient air flowing through the interior channel of the ductwork.

14. The system of claim 13, wherein the electrical computing device includes a temperature sensor to determine a temperature reading of a portion of the electrical computing device, and wherein the electrical computing device is to control the operation of the fan based on the temperature reading of the temperature sensor.

15. The system of claim 13, further comprising:
a chiller positioned upstream of the thermosiphon and in the interior channel of the ductwork to cool the ambient air in the interior channel before it reaches the thermosiphon.

16. The system of claim 13, further comprising:
an air conditioner, as part of the first system, to condition the controlled air in the controlled airflow environment outside of the ductwork.

17. The system of claim 16, wherein the air conditioner includes a chiller to cool the controlled air in the controlled airflow environment outside of the ductwork.

18. The system of claim 16, wherein the air conditioner includes a filter to remove particulates in the controlled air in the controlled airflow environment outside of the ductwork.

19. The system of claim 16, wherein the air conditioner includes a dehumidifier to extract water from the controlled air in the controlled airflow environment outside of the ductwork.

* * * * *